United States Patent [19]

Nakahigashi et al.

[11] Patent Number: 4,866,746
[45] Date of Patent: Sep. 12, 1989

[54] COATED MATERIAL AND X-RAY EXPOSURE MASK

[75] Inventors: Takahiro Nakahigashi; Yasunori Ando; Eiji Kamijo, all of Kyoto, Japan

[73] Assignee: Nissin Electric Co., Ltd., Kyoto, Japan

[21] Appl. No.: 92,537

[22] Filed: Sep. 3, 1987

[30] Foreign Application Priority Data

Sep. 4, 1986 [JP] Japan .................................. 61-209151
Sep. 5, 1986 [JP] Japan .................................. 61-209216

[51] Int. Cl.⁴ ............................ G21F 1/08; B32B 9/00
[52] U.S. Cl. ......................................... 378/35; 428/698
[58] Field of Search ............... 428/627, 641, 704, 457, 428/698; 378/35, 34, 210

[56] References Cited

U.S. PATENT DOCUMENTS

| | | | |
|---|---|---|---|
| 4,253,029 | 2/1981 | Lepselter et al. | 378/35 |
| 4,515,876 | 5/1985 | Yoshihara et al. | 376/35 |
| 4,543,266 | 9/1985 | Matsuo et al. | 378/35 |
| 4,647,517 | 3/1987 | Hersener et al. | 378/35 |
| 4,719,161 | 1/1988 | Kimura | 378/35 |

OTHER PUBLICATIONS

Nakae, Hiroyoki et al., Adherent Boron Nitride Film, Chemical Abstracts, vol. 102, Article 118457g, Nov. 1984.

*Primary Examiner*—John J. Zimmerman
*Attorney, Agent, or Firm*—Finnegan, Henderson, Farabow, Garrett, & Dunner

[57] ABSTRACT

A coated material comprises: a substrate; and a film containing boron, nitrogen and one selected from a group consisting of silicon and germanium, the film being formed on the substrate. An X-ray exposure mask of the present invention comprises: an X-ray absorbent layer; an X-ray permeable support layer for supporting the absorbent layer; and a mask support member for supporting the support layer; wherein the support layer contains boron and nitrogen and one element selected from a group consisting of silicon and germanium.

6 Claims, 2 Drawing Sheets

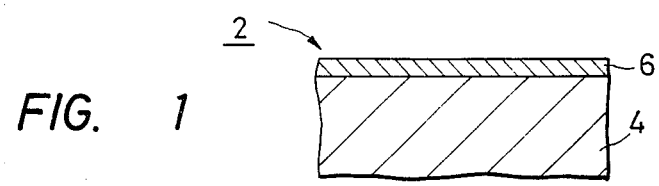
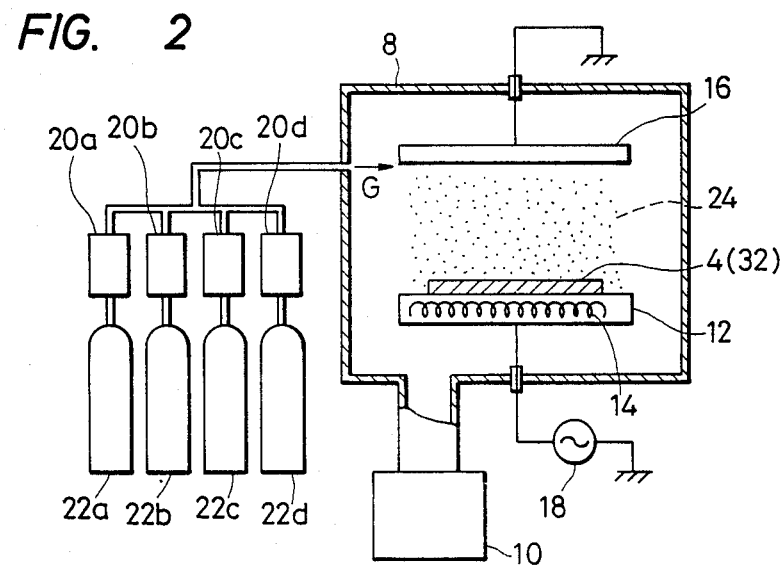
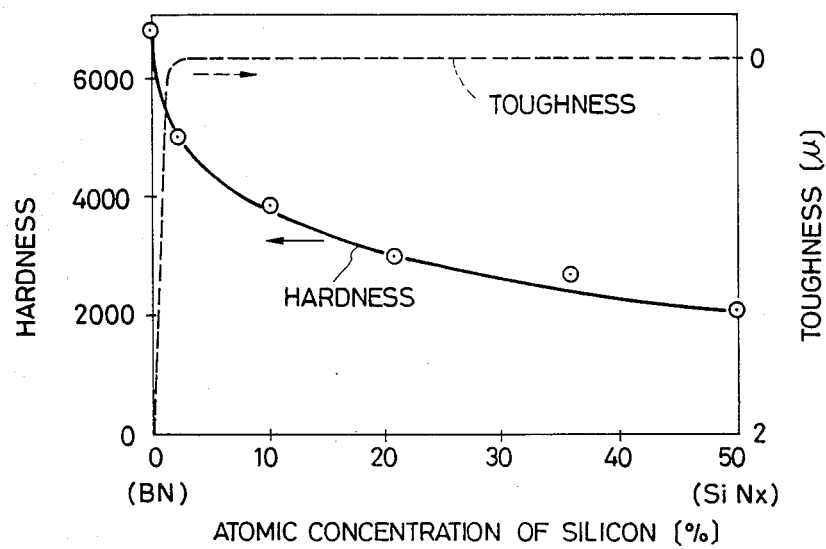

COATED MATERIAL AND X-RAY EXPOSURE MASK

BACKGROUND OF THE INVENTION

This invention relates to a coated material such as a tool material in which a layer of high hardness is formed to a surface of a substrate. This invention also relates to an X-ray exposure mask used for X-ray lithography, for example.

Heretofore, working life of tools has been extended by forming a layer of high hardness comprising boron nitride (BN) or silicon nitride ($Si_3N_4$) to the surface of a substrate of the tool material by means of thermal CVD process, plasma CVD process, light CVD process, or the like.

A layer comprising boron nitride shows a high hardness, but is poor in its toughness. Accordingly, if material coated with the layer is used in a tool, for example, there occurs a problem that the blade tip tends to be lost by chipping. On the other hand, a layer comprising silicon nitride has a good toughness, but is inferior in its hardness as compared with the boron nitride. Accordingly, its use leads to a drawback in view of the working life, etc. of the tool.

Furthermore, such a layer comprising boron nitride or silicon nitride as described above is also employed as an X-ray exposure mask, as will be described hereinafter.

FIGS. 5A through 5F show one example of the manufacturing steps for constructing an X-ray exposure mask. The manufacturing steps to construct an X-ray exposure mask are as follows: A mask support 32 comprising, for example, a silicon single crystal substrate is prepared (FIG. 5A). An X-ray permeable support layer 34 comprising a thin film of boron nitride (BN) or a thin film of silicon nitride (SiNx) is formed on the support 32 by means of a CVD process or a PVD process (FIG. 5B). Then, an X-ray absorbent layer 36 made of, for example, Au, Ta, W, or the like is formed on the layer 34 by means of CVD process, PVD process, or the like (FIG. 5C). In this way, a mask (mask blank) 37 which is not yet subjected to a process such as patterning, etc. can be obtained. Subsequently, for example, after forming a resist pattern 38 over the X-ray absorbent layer 36, (FIG. 5D), the X-ray absorbent layer 36 is patterned by means of ion etching or the like (FIG. 5E). Finally, a window-perforation is applied to the mask support 32, using the support layer 34 as an etching stopper layer by means of wet etching, etc. to obtain a finally fabricated X-ray exposure mask 40 (FIG. 5F).

In the X-ray exposure mask, conventionally, a thin film of boron nitride or a thin film of silicon nitride has generally been used for the X-ray permeable support layer 34, as described above. However, since the thin film of boron nitride is poor in toughness although having high hardness, it has a drawback of easy cracking thus requiring utmost care for the handling thereof in case of using it as the support layer 34. On the other hand, the thin film of silicon nitride has an extremely excellent toughness as compared with the thin film of boron nitride, but is poor in its hardness. Therefore, in the case where silicon nitride is used for the support layer 34 and the window-perforation is applied to the mask support 32, it involves a drawback of warping. Therefore, it is impossible to conduct exact pattern transfer.

SUMMARY OF THE INVENTION

To solve the above-described problems, accordingly, it is an object of this invention to provide a coated material in which a layer capable of providing both high hardness and good toughness is formed on a surface of a substrate.

Therefore, to achieve the above object, coated material of the present invention comprises: a substrate; and a film containing boron, nitrogen and one element selected from a group consisting of silicon and germanium, the film being formed on the substrate.

In the layer described above, the hardness and the toughness can be controlled depending on the atomic concentration of silicon or germanium contained in the layer and therefore both the properties, hardness and toughness, can be provided.

Furthermore, it is an object of the present invention to provide an X-ray exposure mask capable of overcoming the aforementioned problem.

Therefore, to achieve the above object, an X-ray exposure mask of the present invention comprises: an X-ray absorbent layer; an X-ray permeable support layer for supporting the absorbent layer; and a mask support member for supporting the support layer; wherein the support layer contains boron and nitrogen and one element selected from a group consisting of silicon and germanium.

In the support layer described above, the hardness and the toughness can be controlled depending on the atomic concentration of silicon or germanium therein and the toughness can be improved while maintaining the high hardness. Accordingly, it becomes possible to obtain an X-ray exposure mask which is subject to less cracking and warping.

BRIEF DESCRIPTION OF THE ACCOMPANYING DRAWING

FIG. 1 is a schematic cross sectional view of a coated material of one embodiment according to the present invention;

FIG. 2 is a schematic view illustrating one example of a plasma CVD apparatus for manufacturing the coated material of FIG. 1 and the X-ray exposure mask of FIG. 4;

FIG. 3 is a graph showing the characteristics of a layer obtained by an experiment conducted to the coated material of FIG. 1 and to the X-ray exposure mask of FIG. 4;

DETAILED DESCRIPTION OF THE PREFERRED EMBODIMENTS

Figure 4:
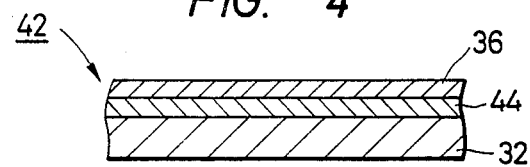
FIG. 4 is a schematic cross sectional view of an X-ray exposure mask according to another embodiment of the present invention.

Referring to the accompanying drawings, the present invention will be described in greater detail hereinafter.

FIG. 1 is a schematic cross sectional view of a coated material of one embodiment according to the present invention. The coated material 2 in this embodiment comprises a substrate 4 and a layer 6 including boron, silicon and nitrogen formed at a surface of the substrate 4. For the substrate 4, various materials can be employed such as tool materials, for example, cemented carbide or hard metal materials and tool steels, silicon substrates, plastic materials, and the like. In addition, various shapes may be employed therefor.

The layer 6 can be formed, for example, by thermal CVD process, plasma CVD process, light CVD process, ion plating, or the like.

In the layer 6, the hardness and the toughness can be controlled by adjusting the atomic concentration of silicon contained therein. In this case, for example, the atomic concentration of nitrogen is set substantially constant, while the atomic concentration of boron is set to a reverse proportion with that of silicon. In the layer 6, both high hardness and the good toughness can be provided.

According to the result obtained by an experiment conducted as will be explained later, the atomic concentration of silicon is, preferably, less than 50% but more than 0% and, within the range, the layer 6 has good toughness while maintaining considerably high hardness. If the atomic concentration of silicon is equal to or more than 50%, the hardness is reduced although the toughness is improved, due to a reason that pure elemental silicon is formed, etc. Particularly, in the case where the atomic concentration of silicon is about in a range from 1 to 5%, a layer 6 obtained has extremely excellent hardness and toughness.

An experiment was conducted so that the layer 6 was formed on the substrate 4 comprising Si <100> or a cemented carbide or hard metal tip, by using a device as shown in FIG. 2.

FIG. 2 is a schematic view illustrating one example of a plasma CVD apparatus, in which a holder 12 serving also as an electrode and an electrode 16 are opposed to each other and a high frequency power source 18 is connected between the holder 12 and the electrode 16. A vacuum vessel 8 is evacuated by a vacuum pump 10. Gases as will be described later from gas sources 22a through 22d are controlled to be mixed as a reaction gas G by flow rate controllers 20a through 20d, and are introduced into the vacuum vessel 8. The substrate 4 is mounted on the holder 12 and heated by a heater 14.

The type of the gases used are as follows: diborane ($B_2H_6$), ammonia ($NH_3$), nitrogen ($N_2$) and monosilane ($SiH_4$). The ammonia and the nitrogen may be provided from separate gas sources to the vacuum vessel. Or, the ammonia and the nitrogen may be provided in such a manner that mixed gas formed from ammonia and nitrogen is provided from a single source. The flow rate of the gases used are as follows: the flow rate of the diborane ($B_2H_6$) is in a range from 0 to 50 ml/min; the flow rate of the ammonia ($NH_3$)+nitrogen ($N_2$), that is, the total flow rate of the ammonia and nitrogen is in a range from 0 to 300 ml/min; and the flow rate of the monosilane ($SiH_4$) is in a range from 0 to 50 ml/min.

A full detail of treatment conducted for forming the layer 6 on the surface of the substrate 4 will be given hereunder: The inside of the vacuum vessel 8 was evacuated to the order of $10^{-7}$ Torr. The reaction gas G was introduced into the vacuum vessel 8 to maintain the pressure inside the vacuum vessel 8 at about 0.01 to 10 torr and a high frequency electric power from the high frequency power source 18 was supplied between the holder 12 and the electrode 16, to form plasma 24. The temperature for the substrate 4 was set in a range from a room temperature to about 700° C. and the high frequency power supplied between the holder 12 and the electrode 16 was set in a range of about 0 to 150 W.

One example of the characteristics of the layer 6 obtained as described above is shown in FIG. 3. In FIG. 3, the horizontal axis represents the atomic concentration (%) of silicon in the layer 6 and the vertical axis represents both the hardness and the toughness values of the layer 6. The hardness was given by vickers hardness and measured by a micro vickers hardness meter under the weight load of 10 gf. The toughness was expressed by the length ($\mu$) of a crack extended from the trace of the weight. In the above-described case, the atomic concentration of nitrogen was made substantially constant and the atomic concentration of boron was made substantially in a reverse proportion with that of silicon. The layer 6 corresponds to conventional boron nitride (BN) when the atomic concentration of silicon was made set to zero (%), and it corresponds to conventional silicon nitride (SiNx) when the atomic concentration of silicon is made to 50%.

As apparent from FIG. 3, the hardness and the toughness of the layer 6 can be controlled by varying the atomic concentration of silicon. For example, when the atomic concentration of silicon was brought nearer to 0%, the hardness becomes extremely higher, but the toughness becomes somewhat poorer. In this case, it is supposed that the layer 6 approaches a boron nitride (BN) layer. On the other hand, as the atomic concentration of silicon is increased, the toughness reaches its maximum at a certain level and becomes saturated, while the hardness is gradually degraded. It is supposed that, in this case, layer 6 approaches a silicon nitride (SiNx) layer as the atomic concentration of silicon is brought nearer to 50%.

As described above, if the atomic concentration of silicon in the layer 6 was less than 50% and more than 0%, a layer 6 of good toughness with its high hardness being maintained could be obtained. In this case, since less cracking was caused, it is considered that the internal stress was also reduced in the layer 6 as compared with a boron nitride layer. Particularly, in the case where the atomic concentration of silicon was about in a range from about 1 to about 5%, a layer 6 of extremely excellent hardness and toughness could be obtained.

Germanium may be contained in the layer 6 instead of silicon. In this case, according to an experiment conducted in the same manner as described above, the hardness value was somewhat lower than that of the layer including silicon, but the changing trend of the hardness was observed to be similar to that of the layer including silicon. The toughness of the layer including germanium was observed to have a similar changing trend to that of the layer including silicon.

The above-described coated material 2 of the present invention can be applied to an X-ray exposure mask, by using the layer 6 as a support layer for the X-ray absorbent layer. In this case, when a window perforating fabrication is applied to the substrate 4, since the layer 6 is provided with both high hardness and good toughness as described above, cracking or warping of the layer 6 can be prevented, as will be described hereinafter.

Figure 5A:
FIGS. 5A through 5F are views illustrating one example of manufacturing steps for an X-ray exposure mask.
Figure 5B:
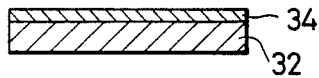
Figure 5C:
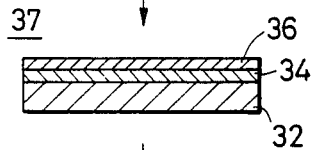
Figure 5D:
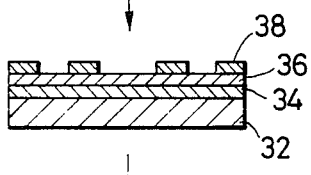
Figure 5E:
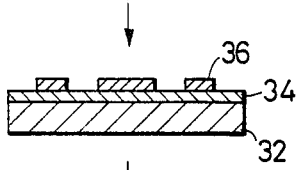
Figure 5F:
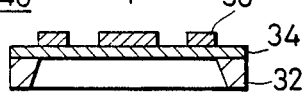

FIG. 4 is a schematic cross sectional view for an X-ray exposure mask to which the present invention is applied. In the Figure, same numerals with those in FIG. 5 designate same or like portions. An X-ray exposure mask 42 in this example comprises an X-ray absorbent layer 36, an X-ray permeable support layer 44 for supporting the absorbent layer 36 and a mask support member 32 for supporting the support layer 44. In this embodiment, the X-ray exposure mask 42 corresponds to the coated material 2 of the first embodiment shown in FIG. 1. The support layer 44 corresponds to the layer 6, and the mask support 32 and the absorbant layer 36, to which fabrications such as patterning and window-perforation are to be applied, respectively, correspond to the substrate 4. In other words, the support layer 44 includes boron, silicon and nitrogen, or includes boron, germanium and nitrogen. In FIG. 4, patterning or window-perforation fabrications are not yet applied to the X-ray absorbent layer 36 and the mask support 32, but such fabrications as conducted, for example, by way of the steps as shown in FIGS. 5D to 5F may be applied to the layer 36 and the support 32.

The layer 44 can be formed, for example, by a thermal CVD process, plasma CVD process, light CVD process, ion plating, or the like.

The layer 44 has X-ray permeability. Furthermore, in the layer 44, the hardness and the toughness can be controlled by adjusting the atomic concentration of silicon contained therein. In this case, for example, the atomic concentration of nitrogen is set substantially constant, while the atomic concentration of boron is set to a reverse proportion with that of silicon. In the layer 44, both the high hardness and the good toughness can be provided.

The atomic concentration of silicon is, preferably, less than 50% but more than 0% and, within the range, the layer 44 has good toughness while maintaining considerably high hardness. If the atomic concentration of silicon is equal to or more than 50%, the hardness is reduced although the toughness is improved, due to a reason that pure elemental silicon is formed, etc. Particularly, in the case where the atomic concentration of silicon is about in a range from 1 to 5%, a layer 44 has extremely excellent hardness and toughness.

Accordingly, the X-ray exposure mask 42 having the support layer 44 as described above has an advantage that the support layer 44 is less likely to crack or warp even if window-perforation is applied to the mask support 32.

An experiment was conducted that the support layer 44 was formed on the mask support 32 made of Si<100>, in the same manner as the above-described experiment conducted to the coated material 2 of the first embodiment, as follows: The mask support 32 was mounted on the holder 12 in the vacuum vessel 8 of the plasma CVD apparatus of FIG. 2 and heated by the heater 14. The inside of the vacuum vessel 8 was evacuated to the order of $10^{-7}$ Torr. The reaction gas G was introduced into the vacuum vessel 8 to maintain the pressure inside the vacuum vessel 8 at about 0.01 to 10 torr and a high frequency electric power from the high frequency power source 18 was supplied between the holder 12 and the electrode 16, to form plasma 24. The temperature for the mask support 32 was set in a range from a room temperature to about 700° C. The type of the gases provided from the gas sources 22a to 22d through the flow rate controllers 20a to 20d to be mixed to form the reaction gas G are as follows: diborane ($B_2H_6$), ammonia ($NH_3$), nitrogen ($N_2$) and monosilane ($SiH_4$). The ammonia and the nitrogen may be provided from separate gas sources to the vacuum vessel. Or, the ammonia and the nitrogen may be provided in such a manner that a mixed gas formed from ammonia and nitrogen is provided from a single source. The flow rate of the gases used are as follows: the flow rate of the diborane ($B_2H_6$) is in a range from 0 to 50 ml/min; the flow rate of the ammonia ($NH_3$)+nitrogen ($N_2$), that is, the total flow rate of the ammonia and nitrogen is in a range from 0 to 100 ml/min; and the flow rate of the monosilane ($SiH_4$) is in a range from 0 to 50 ml/min.

The support layer 44 obtained as described above showed the same characteristics as shown in FIG. 3.

Therefore, as shown in FIG. 3, if the atomic concentration of silicon in the layer 44 was less than 50% and more than 0%, a layer 44 of good toughness with its high hardness being maintained could be obtained. In this case, since less cracking was caused, it is considered that the internal stress was also reduced in the layer 44 as compared with a boron nitride layer. Particularly, in the case where the atomic concentration of silicon was about in a range from about 1 to about 5%, a layer 44 of extremely excellent hardness and toughness could be obtained.

Germanium may be contained in the layer 44 instead of silicon. In this case, according to an experiment conducted in the same manner as described above, the hardness value was somewhat lower than that of the layer including silicon, but the changing trend of the hardness was observed to be similar to that of the layer including silicon. The toughness of the layer including germanium was observed to have a similar changing trend to that of the layer including silicon.

As described above, in the coated material according to the present invention, the hardness and the toughness of the surface layer can be controlled depending on the atomic concentration of silicon or germanium contained in the layer and, in addition, both the high hardness and the good toughness can be provided.

Particularly, by applying the present invention to an X-ray exposure mask, since both the high hardness and the good toughness can be provided in a support layer in the mask, it makes it possible to obtain an X-ray exposure mask which is less likely to crack and warp.

The coated material 2 having the layer 6 as described above formed at the surface of the substrate 4 can be utilized in various fields by taking the advantage of the high hardness and the good toughness of the layer 6. For example, if the material is utilized for a tool, it is possible to extend its working life while preventing the loss of a blade due to chipping which has occurred in the conventional tool coated with a boron nitride layer.

Furthermore, when the material 2 is utilized for a cylinder, a bearing, a shaft, or the like, both abrasion resistance and heat resistance characteristics can be improved. In the case of utilizing the material 2 for gas heat pipes or couplings their heat resistance can be improved and chemical resistance.

What is claimed is:

1. A coated material, comprising:
    a substrate; and
    a film coated on said substrate including a first component, a second component, and a third component;
    said first component being a predetermined atomic concentration of boron;
    said second component being a predetermined atomic concentration of nitrogen; and
    said third component being a predetermined atomic concentration of germanium to provide toughness.

2. The coated material of claim 1, wherein the atomic concentration of germanium in the film is more than 0% and less than 50%.

3. The coated material of claim 2 wherein the atomic concentration of germanium in the film is in a range of 1% to 5%.

4. An X-ray exposure mask, comprising:

an X-ray absorbent layer;

an X-ray permeable support layer for supporting said absorbent layer; and a mask support member for supporting said support layer;

wherein said support layer includes a first component, a second component, and a third component;

said first component being a predetermined atomic concentration of boron; said second component being a predetermined atomic concentration of nitrogen; and said third component being a predetermined atomic concentration of germanium to provide toughness.

5. The X-ray exposure mask of claim 4, wherein the atomic concentration of germanium in the support layer is more than 0% and less than 50%.

6. The X-ray exposure mask of claim 5, wherein the atomic concentration of germanium in said support layer is in a range of 1% to 5%.

* * * * *